US012635453B2

(12) United States Patent  
Kobayashi

(10) Patent No.: US 12,635,453 B2  
(45) Date of Patent: May 19, 2026

(54) TEMPERATURE CONTROL DEVICE, SUBSTRATE PROCESSING APPARATUS, AND LIQUID AMOUNT CONTROL METHOD

(71) Applicant: Tokyo Electron Limited, Tokyo (JP)

(72) Inventor: Kei Kobayashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 125 days.

(21) Appl. No.: 18/607,400

(22) Filed: Mar. 15, 2024

(65) Prior Publication Data

US 2024/0222169 A1 Jul. 4, 2024

Related U.S. Application Data

(63) Continuation of application No. PCT/JP2022/038217, filed on Oct. 13, 2022.

(30) Foreign Application Priority Data

Oct. 15, 2021 (JP) ................................. 2021-169232

(51) Int. Cl.
*H01L 21/67* (2006.01)
*H01L 21/683* (2006.01)

(52) U.S. Cl.
CPC .... *H01L 21/67248* (2013.01); *H01L 21/6831* (2013.01)

(58) Field of Classification Search
CPC ........... H01L 21/67248; H01L 21/6831; H01L 21/3065; H01L 21/67253
USPC ........................................ 165/301
See application file for complete search history.

(56) References Cited

U.S. PATENT DOCUMENTS

| | | | |
|---|---|---|---|
| 2008/0289811 A1 | 11/2008 | Kariya | |
| 2013/0075059 A1* | 3/2013 | Kil | H01L 21/67109 165/104.11 |
| 2020/0132344 A1 | 4/2020 | Seki | |

FOREIGN PATENT DOCUMENTS

| | | |
|---|---|---|
| JP | 2001-066029 A | 3/2001 |
| JP | 2007-026157 A | 2/2007 |
| JP | 2008-116199 A | 5/2008 |
| JP | 2014-063972 A | 4/2014 |
| JP | 2014-127534 A | 7/2014 |

OTHER PUBLICATIONS

International Search Report and Written Opinion mailed on Dec. 20, 2022, received for International Patent Application No. PCT/JP2022/038217, filed on Oct. 13, 2022, 08 pages including English Translation.

* cited by examiner

*Primary Examiner* — Steve S Tanenbaum

(74) *Attorney, Agent, or Firm* — XSENSUS LLP

(57) ABSTRACT

A temperature control device includes a main tank configured to store a heating medium, a first sub-tank at a position above a reference position in the main tank, a second sub-tank at a position below the reference position in the main tank, a first connector pipe connecting the first sub-tank and the main tank and including a first valve, a second connector pipe connecting the second sub-tank and the main tank and including a second valve, and a controller circuit configured to control the first valve and the second valve based on a liquid amount of the heating medium in the main tank.

17 Claims, 9 Drawing Sheets

FIG. 9

TEMPERATURE CONTROL DEVICE, SUBSTRATE PROCESSING APPARATUS, AND LIQUID AMOUNT CONTROL METHOD

CROSS-REFERENCE TO RELATED APPLICATIONS

The present application is a bypass continuation application of International Patent Application No. PCT/JP2022/038217, filed Oct. 13, 2022, which claims priority to Japanese Application No. 2021-169232, filed Oct. 15, 2021, the entire contents of each of which is being incorporated herein by reference.

FIELD

The present disclosure relates to a temperature control device, a substrate processing apparatus, and a liquid amount control method.

BACKGROUND

A substrate processing apparatus controls its temperature with a chiller that uses a pump to circulate a heating medium through a channel in a substrate support. The amount of liquid in the tank is controlled during the operation of the chiller. In one example, a reservoir tank located above a cooling tank and a heating tank is connected to the cooling tank and to the heating tank by piping to allow additional supply of a heating medium (Patent Literature 1). In another example, a common tank connected to a lower-temperature storage tank and to a higher-temperature storage tank supplies a heating medium (Patent Literature 2).

CITATION LIST

Patent Literature

Patent Literature 1: U.S. Patent Application Publication No. 2008/0289811
Patent Literature 2: U.S. Patent Application Publication No. 2020/0132344

SUMMARY

Technical Problem

One or more aspects of the present disclosure are directed to a temperature control device, a substrate processing apparatus, and a liquid amount control method that can automatically control the liquid amount of a heating medium.

Solution to Problem

A temperature control device according to one aspect of the present disclosure includes a main tank storing a heating medium, a first sub-tank at a position above a reference position of a liquid surface in the main tank, a second sub-tank at a position below the reference position in the main tank, a first connector pipe connecting the first sub-tank and the main tank and including a first valve, a second connector pipe connecting the second sub-tank and the main tank and including a second valve, and a controller that controls the first valve and the second valve based on a liquid amount in the main tank.

Advantageous Effects

The technique according to the above aspect of the present disclosure can automatically control the liquid amount of a heating medium.

BRIEF DESCRIPTION OF DRAWINGS

FIG. 9 is a diagram of an example temperature control device according to a fourth modification.

DETAILED DESCRIPTION

A temperature control device, a substrate processing apparatus, and a liquid amount control method according to embodiments of the present disclosure will now be described in detail with reference to the drawings. The technique according to embodiments of the present disclosure is not limited to the embodiments described below.

During the operation of a chiller, the substrate processing apparatus is stopped temporarily when the amount of a heating medium in a tank decreases, and an operator adds the heating medium to the tank. To accommodate an error in the refilling operation performed by the operator manually adding the heating medium, the range of appropriate values for the liquid amount is to be set wider. This is expected to be performed by advanced automatic control of the liquid amount of the heating medium without stopping the substrate processing apparatus.

Structure of Substrate Processing Apparatus 1

Figure 1:
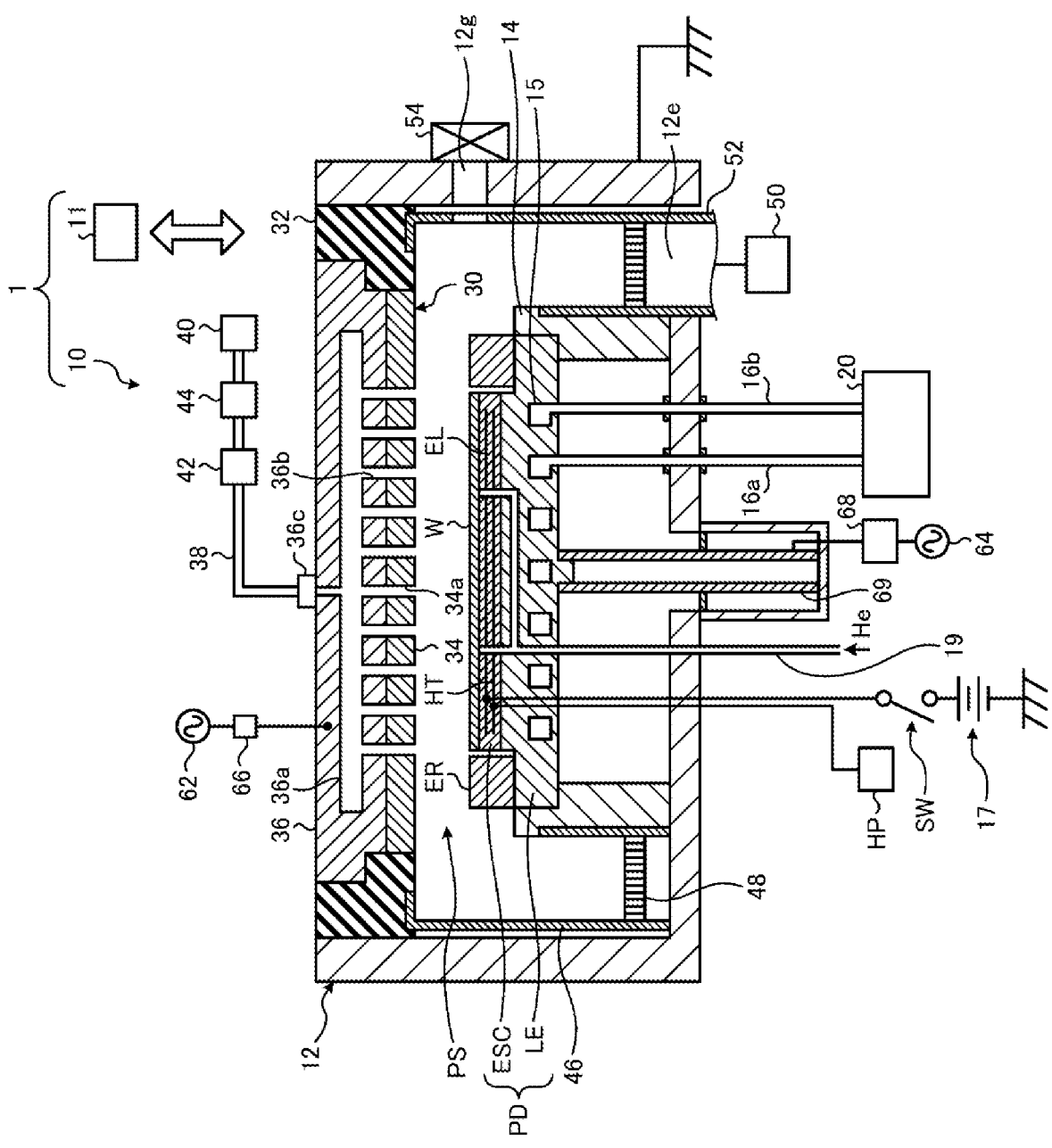
FIG. 1 is a schematic cross-sectional view of an example substrate processing apparatus according to one embodiment of the present disclosure.

FIG. 1 is a schematic cross-sectional view of an example substrate processing apparatus according to one embodiment of the present disclosure. A substrate processing apparatus 1 is, for example, a plasma etching apparatus including parallel plate electrodes. The substrate processing apparatus 1 includes a body 10 and a control device 11. The body 10 is formed from a material such as aluminum. The body 10 includes, for example, a substantially cylindrical process chamber 12. The process chamber 12 has its inner wall surfaces processed with anodic oxidation. The process chamber 12 is grounded for protection.

The process chamber 12 includes, on its bottom, a substantially cylindrical support 14 formed from an insulating material such as quartz. The support 14 extends in the process chamber 12 in the vertical direction (e.g., toward an upper electrode 30) from the bottom of the process chamber 12.

A substrate support PD is located in the process chamber 12. The substrate support PD is supported by the support 14. The substrate support PD holds a wafer W on its upper surface. The wafer W is an example of a temperature control target. The substrate support PD includes an electrostatic chuck ESC and a lower electrode LE. The lower electrode LE is formed from a metal material such as aluminum and is substantially disk-shaped. The electrostatic chuck ESC is located on the lower electrode LE. The lower electrode LE is an example of a heat-exchange member that exchanges heat with the temperature control target.

The electrostatic chuck ESC includes an electrode EL being a conductive film between a pair of insulating layers or a pair of insulating sheets. The electrode EL is electrically coupled to a direct current (DC) power supply 17 with a switch SW. The electrostatic chuck ESC clamps the wafer W on its upper surface with an electrostatic force such as a Coulomb force generated by a DC voltage applied from the DC power supply 17. The electrostatic chuck ESC can thus hold the wafer W.

The electrostatic chuck ESC receives a heat transfer gas such as a He gas through a pipe 19. The heat transfer gas supplied through the pipe 19 is supplied between the electrostatic chuck ESC and the wafer W. Adjusting the pressure of the heat transfer gas supplied between the electrostatic chuck ESC and the wafer W can adjust the thermal conductivity between the electrostatic chuck ESC and the wafer W.

A heater HT being a heating element is located in the electrostatic chuck ESC. The heater HT is coupled to a heater power supply HP. The heater HT receiving power from the heater power supply HP can heat the wafer W on the electrostatic chuck ESC through the electrostatic chuck ESC. The lower electrode LE and the heater HT adjust the temperature of the wafer W placed on the electrostatic chuck ESC. The heater HT may be located between the electrostatic chuck ESC and the lower electrode LE.

An edge ring ER surrounds the electrostatic chuck ESC to surround the edge of the wafer W and the electrostatic chuck ESC. The edge ring ER may also be called a focus ring. The edge ring ER increases uniformity in the processing across the surface of the wafer W. The edge ring ER is formed from a material such as quartz selected as appropriate based on the material of the etching target film.

The lower electrode LE defines an internal channel 15 through which a heating medium being an insulating fluid such as Galden (registered trademark) flows. The heating medium may be referred to as brine. The channel 15 is connected to a temperature control device 20 with pipes 16a and 16b. The temperature control device 20 controls the temperature of the heating medium flowing through the channel 15 in the lower electrode LE. The heating medium with the temperature controlled by the temperature control device 20 is supplied into the channel 15 in the lower electrode LE through the pipe 16a. The heating medium flows through the channel 15 and returns to the temperature control device 20 through the pipe 16b.

The temperature control device 20 circulates the heating medium flowing through the channel 15 in the lower electrode LE. The temperature control device 20 also controls the temperature of the heating medium set to a set temperature (e.g., 35° C.). The temperature of the lower electrode LE is controlled to the set temperature by the heater HT and the heating medium flowing through the channel 15. The temperature control device 20 and the control device 11 are examples of a heating medium control device.

The lower electrode LE has a lower surface electrically coupled to a power supply pipe 69 for providing radio-frequency (RF) power to the lower electrode LE. The power supply pipe 69 is formed from a metal. Although not shown in FIG. 1, a space between the lower electrode LE and the bottom of the process chamber 12 contains, for example, a lifter pin and its drive assembly for transferring and receiving the wafer W on the electrostatic chuck ESC.

The power supply pipe 69 is coupled to a first RF power supply 64 with a matcher 68 in between. The first RF power supply 64 generates RF power, or in other words, RF bias power, for drawing ions to the wafer W and generates RF bias power with a frequency of, for example, 400 kHz to 40.68 MHz. In one example, the first RF power supply 64 generates RF bias power with a frequency of 13.56 MHz. The matcher 68 is a circuit for matching the output impedance of the first RF power supply 64 and the input impedance of a load (the lower electrode LE). The RF bias power generated by the first RF power supply 64 is provided to the lower electrode LE through the matcher 68 and the power supply pipe 69.

The upper electrode 30 is located above the substrate support PD and faces the substrate support PD. The lower electrode LE is substantially parallel to the upper electrode 30. Plasma is generated in a space between the upper electrode 30 and the lower electrode LE. The generated plasma is used to perform plasma processing, such as etching, on the wafer W held on the upper surface of the electrostatic chuck ESC. The space between the upper electrode 30 and the lower electrode LE is referred to as a process space PS.

The upper electrode 30 is supported in an upper portion of the process chamber 12 with an insulating shield 32 formed from, for example, quartz. The upper electrode 30 includes an electrode plate 34 and an electrode support 36. The electrode plate 34 has a lower surface facing the process space PS. The electrode plate 34 has multiple gas outlets 34a. The electrode plate 34 is formed from a material including, for example, silicon.

The electrode support 36 is formed from a conductive material such as aluminum and supports the electrode plate 34 from above in a detachable manner. The electrode support 36 may have a water-cooling structure (not shown). The electrode support 36 has an internal diffusion compartment 36a. Multiple gas passages 36b continuous with the gas outlets 34a in the electrode plate 34 extend downward (toward the substrate support PD) from the diffusion compartment 36a. The electrode support 36 includes a gas inlet 36c that introduces a process gas into the diffusion compartment 36a. The gas inlet 36c is connected to a pipe 38.

The pipe 38 is connected to a set of gas sources 40 through a set of valves 42 and a set of flow controllers 44. The gas source set 40 includes multiple gas sources. The valve set 42 includes multiple valves. The flow controller set 44 includes multiple flow controllers such as mass flow controllers. The gas sources in the gas source set 40 are connected to the pipe 38 with the respective valves in the valve set 42 and with the respective flow controllers in the flow controller set 44 in between.

This structure allows the body 10 to supply a process gas from one or more gas sources selected within the gas source set 40 to the diffusion compartment 36a in the electrode support 36 at an individually adjusted flow rate. The process gas supplied to the diffusion compartment 36a diffuses in the diffusion compartment 36a and is supplied to the process space PS through the gas passages 36b and the gas outlets 34a in a shower-like manner. The electrode support 36 is coupled to a second RF power supply 62 with a matcher 66 in between. The second RF power supply 62 is a power source for generating RF power to generate plasma and generates RF power with a frequency of, for example, 27 to 100 MHz. In one example, the second RF power supply 62 generates RF power with a frequency of 60 MHz. The matcher 66 is a circuit for matching the output impedance of the second RF power supply 62 and the input impedance of a load (the upper electrode 30). The RF power generated by the second RF power supply 62 is provided to the upper electrode 30 through the matcher 66. The second RF power supply 62 may be coupled to the lower electrode LE with the matcher 66 in between.

A deposition shield 46 formed from, for example, aluminum having a surface coated with, for example, $Y_2O_3$ or quartz is located on an inner wall surface of the process chamber 12 and an outer side surface of the support 14 in a detachable manner. The deposition shield 46 can prevent etching byproducts (deposition) from adhering to the process chamber 12 and the support 14.

An exhaust plate 48 formed from, for example, aluminum having a surface coated with, for example, $Y_2O_3$ or quartz is located near the bottom of the process chamber 12 (near a position receiving the support 14) between an outer side wall of the support 14 and an inner side wall of the process chamber 12. An outlet 12$e$ is located below the exhaust plate 48. The outlet 12$e$ is connected to an exhaust device 50 with an exhaust pipe 52.

The exhaust device 50 includes a vacuum pump such as a turbomolecular pump and can reduce the pressure in a space in the process chamber 12 to an intended degree of vacuum. The process chamber 12 has an opening 12$g$ in its side wall to load and unload the wafer W. The opening 12$g$ can be open and closed by a gate valve 54.

The control device 11 includes a processor, a memory, and an input-output interface. The memory stores a program to be executed by the processor and a recipe including, for example, conditions for individual processes. The processor executes the program read from the memory and controls the components of the body 10 through the input-output interface based on the recipe stored in the memory to perform predetermined processing, such as etching, on the wafer W. The control device 11 is an example of a controller.

Structure of Temperature Control Device 20

Figure 2:
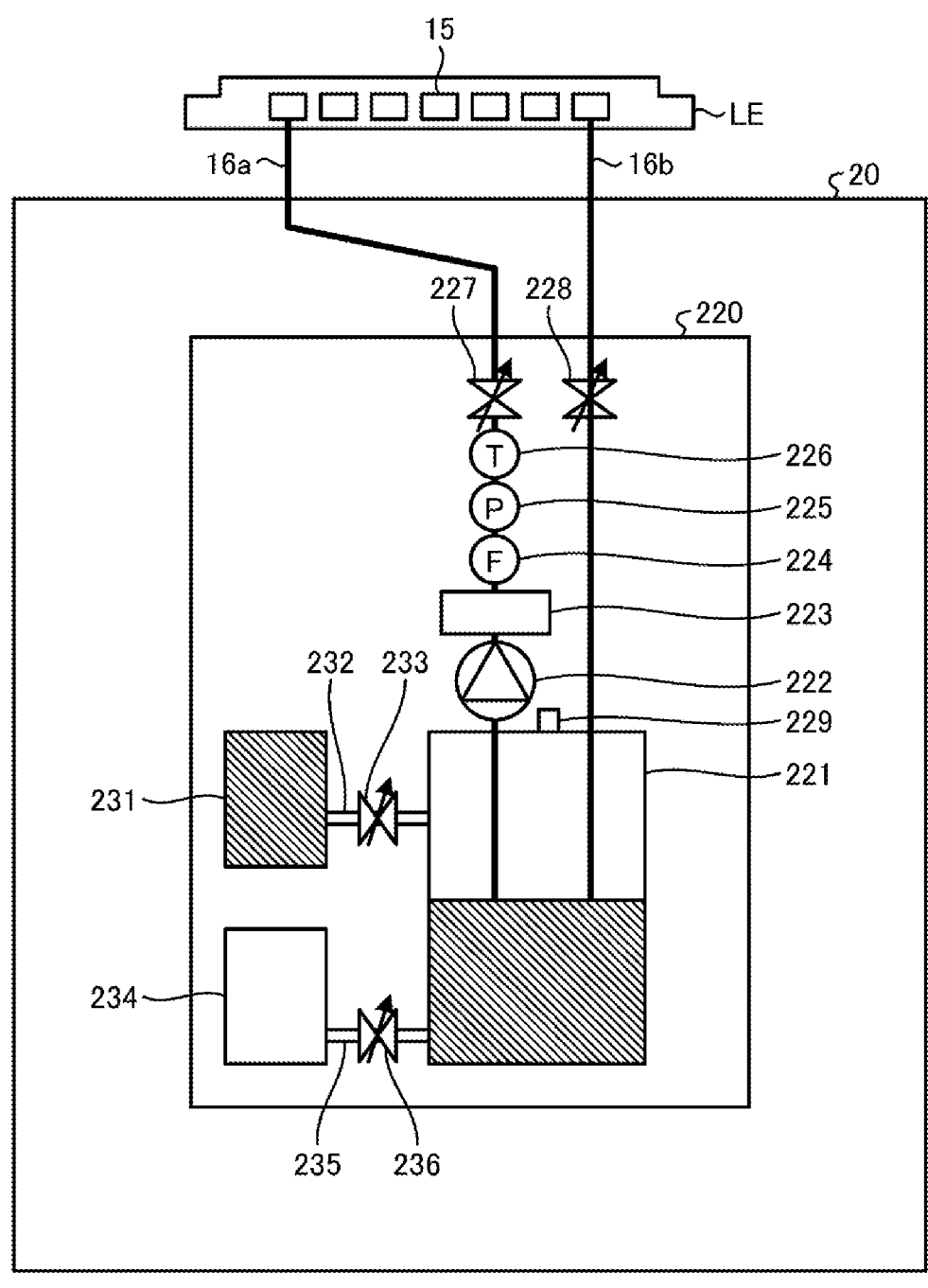
FIG. 2 is a diagram of an example temperature control device according to the embodiment.

FIG. 2 is a diagram of an example temperature control device according to the present embodiment. The temperature control device 20 includes a temperature controller 220. The temperature control device 20 is installed on, for example, a lower floor than the process chamber 12.

The temperature controller 220 is connected to the pipe 16$a$, through which the heating medium is supplied. The temperature controller 220 is connected to the pipe 16$b$, through which the heating medium returns. The temperature controller 220 supplies the heating medium into the channel 15 in the lower electrode LE through the pipe 16$a$. The heating medium discharged from the channel 15 returns to the temperature controller 220 through the pipe 16$b$. The temperature controller 220 controls the temperature of the heating medium to be supplied to the set temperature.

In the temperature controller 220, a pump 222 supplies heating medium in a reservoir tank 221 into the pipe 16$a$. A heat exchanger 223, a flow rate sensor 224, a pressure sensor 225, a temperature sensor 226, and a variable valve 227 are located near the outlet of the pump 222. In other words, the heat exchanger 223, the flow rate sensor 224, the pressure sensor 225, the temperature sensor 226, and the variable valve 227 are located immediately downstream from the pump 222. The heat exchanger 223 heats or cools the heating medium to be supplied to the pipe 16$a$ to the set temperature.

The flow rate sensor 224 detects the flow rate of the heating medium supplied from the pump 222 in an upstream portion of the pipe 16$a$. The pressure sensor 225 detects the pressure of the heating medium supplied from the pump 222 in the upstream portion of the pipe 16$a$. The temperature sensor 226 detects the temperature of the heating medium supplied from the pump 222 in the upstream portion of the pipe 16$a$. The variable valve 227, together with a variable valve 228 on the pipe 16$b$ being a return pipe, adjusts the pressure of the heating medium supplied from the pump 222 in the pipe 16$a$. The reservoir tank 221 is an example of a main tank.

A sensor 229 that detects the liquid surface of the heating medium stored in the reservoir tank 221 is located on the upper surface of the reservoir tank 221. The sensor 229 detects the height of the liquid surface of the heating medium with a range sensor that detects reflection from the liquid surface using, for example, ultrasonic waves, radio waves, or laser beams. The sensor 229 outputs the detected height of the liquid surface to the control device 11. The control device 11 determines the liquid amount of the heating medium in the reservoir tank 221 based on the height of the liquid surface. The sensor 229 may be another type of sensor, such as a floating sensor, that detects the height of the liquid surface of the heating medium. The sensor 229 may determine the liquid amount of the heating medium in the reservoir tank 221 by weighing the reservoir tank 221. In the example described below, the height of the liquid surface detected by the sensor 229 is associated with the liquid amount in advance. In other words, a reference position is the height of the liquid surface corresponding to a reference value of the liquid amount, a refilling start position is the height of the liquid surface corresponding to a refilling start level of the liquid amount, and a collection start position is the height of the liquid surface corresponding to a collection start level of the liquid amount. The reference position, the refilling start position, and the collection start position can each be set at any position that can maintain circulation of the heating medium without an overflow.

A first sub-tank 231 is at a position above the reference position of the liquid surface in the reservoir tank 221. The first sub-tank 231 is connected to the reservoir tank 221 with a pipe 232 and a first valve 233$a$ at a position above the reference position of the liquid surface in the reservoir tank 221. The pipe 232 is connected to a side surface of the first sub-tank 231 at or near the bottom of the side surface. The first sub-tank 231 stores the heating medium to be added when the level of the heating medium in the reservoir tank 221 is below the reference position by a predetermined amount and reaches the refilling start position. The first valve 233 is controlled to open in response to the liquid surface in the reservoir tank 221 reaching the refilling start position and to close in response to the liquid surface reaching the reference position. The first sub-tank 231 may include a liquid-level meter such as a level gauge to allow the operator to check the internal liquid amount. The pipe 232 is an example of a first connector pipe. The first valve 233 may be an on-off control valve or a proportional control valve.

A second sub-tank 234 is at a position below the reference position of the liquid surface in the reservoir tank 221. The second sub-tank 234 is connected to the reservoir tank 221 with a pipe 235 and a second valve 236 at a position below the reference position of the liquid surface in the reservoir tank 221. The pipe 235 is connected to the reservoir tank 221 at or near the bottom of a side surface of the reservoir tank 221. The second sub-tank 234 stores the heating medium collected when the level of the heating medium in the reservoir tank 221 exceeds the reference position by a predetermined amount and reaches the collection start position. The second valve 236 is controlled to open in response to the liquid surface in the reservoir tank 221 reaching the collection start position and to close in response to the liquid surface reaching the reference position. The second sub-tank 234 may include a liquid-level meter such as a level gauge to allow the operator to check the internal liquid amount. The pipe 235 is an example of a second connector pipe. The second valve 236 may be an on-off control valve or a proportional control valve.

Liquid Amount Control Method

Figure 3:
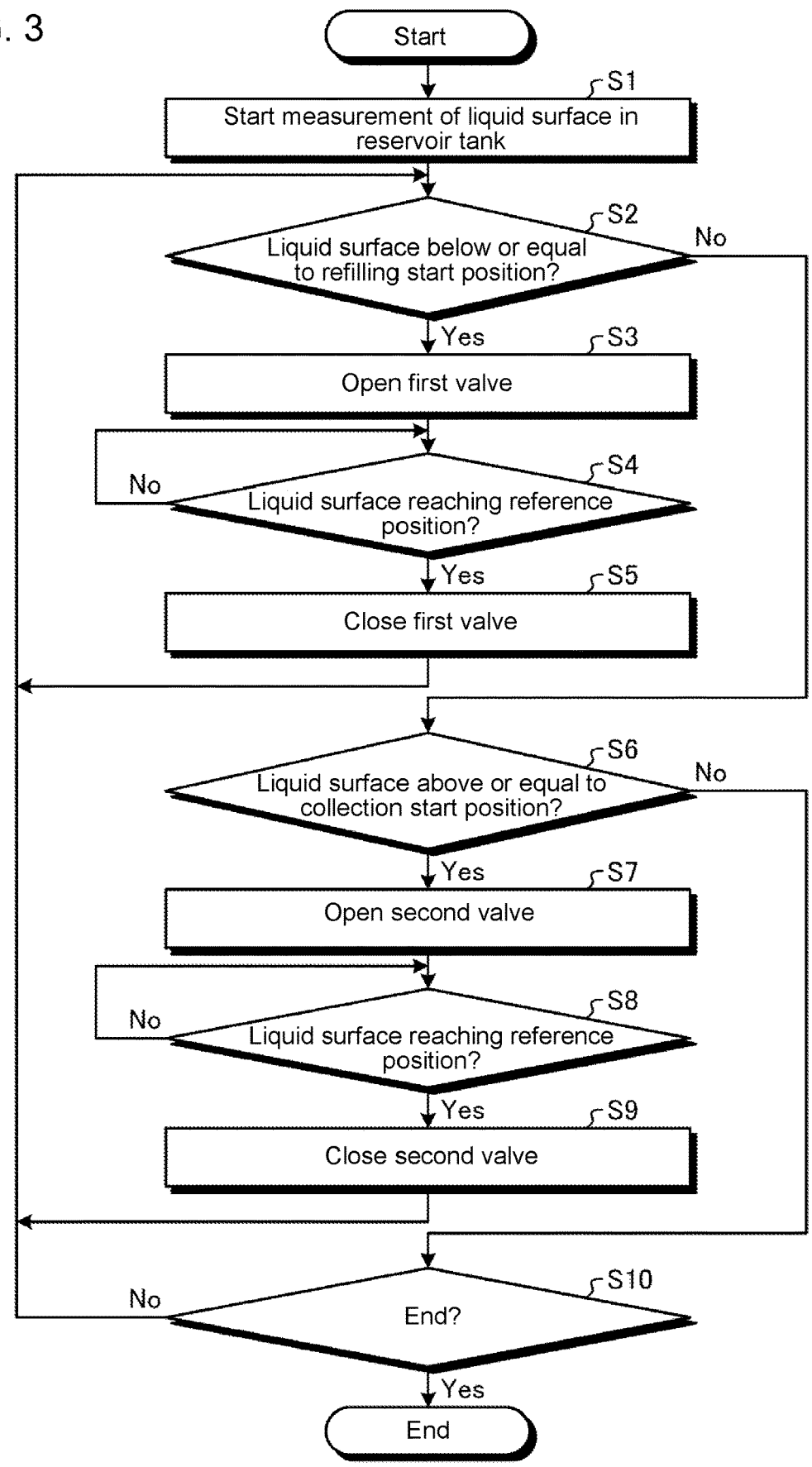
FIG. 3 is a flowchart of an example liquid amount control process in the embodiment.

A liquid amount control method according to the present embodiment will now be described. FIG. 3 is a flowchart of an example liquid amount control process in the present embodiment.

The control device 11 operates the pump 222 to start circulation of the heating medium on a path through the pipe 16*a*, the channel 15, and the pipe 16*b*. The control device 11 controls the heat exchanger 223 and the opening degree of the variable valve 227 based on the temperature detected by the temperature sensor 226, and controls the temperature of the circulating heating medium to the set temperature. After starting circulation of the heating medium, the control device 11 starts measurement of the liquid surface in the reservoir tank 221 (step S1).

The control device 11 determines whether the liquid surface in the reservoir tank 221 is below or equal to the refilling start position (step S2). When determining that the liquid surface in the reservoir tank 221 is below or equal to the refilling start position (Yes in step S2), the control device 11 opens the first valve 233 (step S3). With the first valve 233 being open, the heating medium is added to the reservoir tank 221 from the first sub-tank 231 through the pipe 232.

The control device 11 determines whether the liquid surface in the reservoir tank 221 has reached the reference position (step S4). When determining that the liquid surface in the reservoir tank 221 is yet to reach the reference position (No in step S4), the control device 11 repeats determination in step S4. When determining that the liquid surface in the reservoir tank 221 has reached the reference position (Yes in step S4), the control device 11 closes the first valve 233 (step S5) and returns to step S2.

When determining that the liquid surface in the reservoir tank 221 exceeds the refilling start position (No in step S2), the control device 11 determines whether the liquid surface in the reservoir tank 221 is above or equal to the collection start position (step S6). When determining that the liquid surface in the reservoir tank 221 is above or equal to the collection start position (Yes in step S6), the control device 11 opens the second valve 236 (step S7). With the second valve 236 being open, the heating medium is collected in the second sub-tank 234 from the reservoir tank 221 through the pipe 235.

The control device 11 determines whether the liquid surface in the reservoir tank 221 has reached the reference position (step S8). When determining that the liquid surface in the reservoir tank 221 is yet to reach the reference position (No in step S8), the control device 11 repeats determination in step S8. When determining that the liquid surface in the reservoir tank 221 has reached the reference position (Yes in step S8), the control device 11 closes the second valve 236 (step S9) and returns to step S2.

When determining that the liquid surface in the reservoir tank 221 is below the collection start position (No in step S6), the control device 11 determines whether to end the liquid amount control process (step S10). When determining not to end the liquid amount control process (No in step S10), the control device 11 returns to step S2. When determining to end the liquid amount control process (Yes in step S10), the control device 11 stops the pump 222 and ends the liquid amount control process. In this manner, the liquid amount of the heating medium can be controlled automatically and can maintain a predetermined value. The first sub-tank 231 and the second sub-tank 234 can receive maintenance while the substrate processing apparatus 1 and the temperature control device 20 are operating and the heating medium in the reservoir tank 221 is circulating. In other words, the temperature control device 20 can operate without downtime. Additionally, the first sub-tank 231 for refilling is at a position above the reference position of the liquid surface in the reservoir tank 221, and the second sub-tank 234 for collection is at a position below the reference position of the liquid surface in the reservoir tank 221. Thus, the heating medium can be added and collected by simply controlling the first valve 233 and the second valve 236.

Specific Examples of Addition and Collection of Heating Medium

Figure 4:
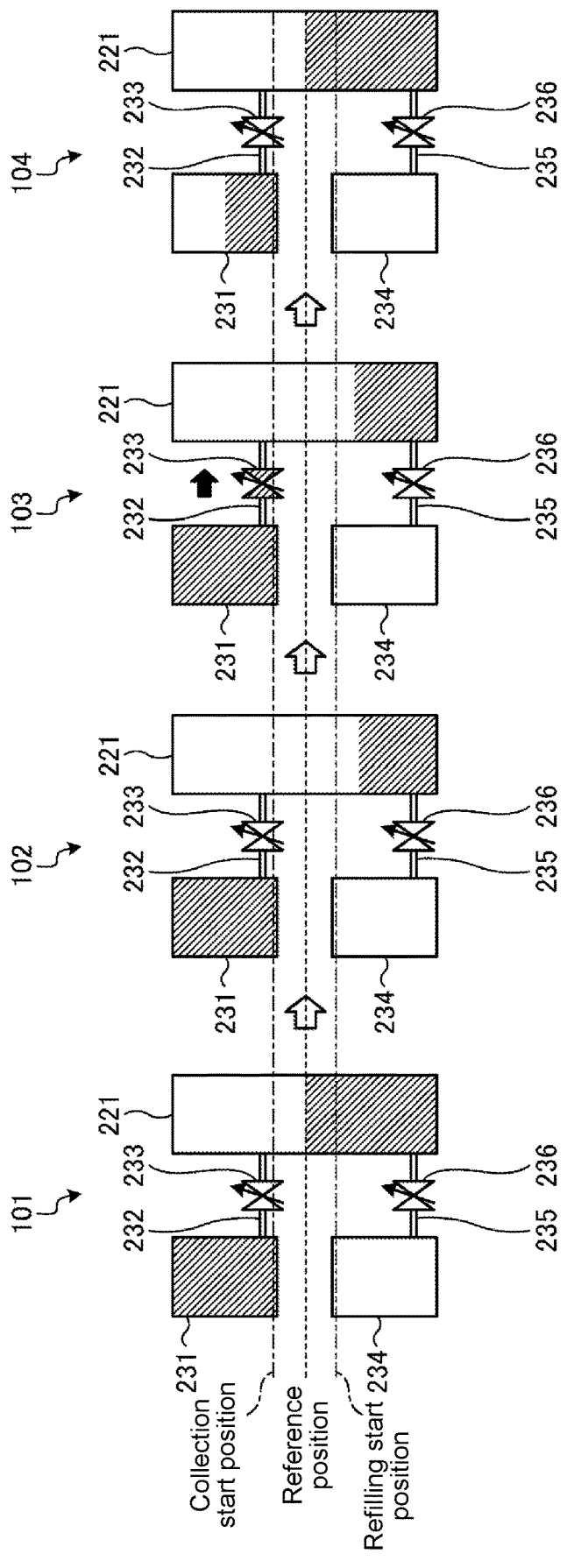
FIG. 4 is a diagram describing an example operation of adding a heating medium in the embodiment.

Specific examples of addition and collection of the heating medium will now be described with reference to FIGS. 4 and 5. FIG. 4 is a diagram describing an example operation of adding the heating medium in the present embodiment. FIG. 4 shows a state 101 in which the liquid surface in the reservoir tank 221 is at the reference position. In this state, the first sub-tank 231 is filled with the heating medium for refilling, and the second sub-tank 234 is empty. The first valve 233 and the second valve 236 are both closed.

As shown in a state 102, when the liquid surface in the reservoir tank 221 lowers to a position below or equal to the refilling start position, the control device 11 controls the first valve 233 to open as shown in a state 103. The heating medium is then added to the reservoir tank 221 from the first sub-tank 231 through the pipe 232. The heating medium moves from the first sub-tank 231 to the reservoir tank 221 under gravity. Subsequently, when the liquid surface in the reservoir tank 221 reaches the reference position as shown in a state 104, the control device 11 controls the first valve 233 to close. This completes addition of the heating medium to the reservoir tank 221.

Figure 5:
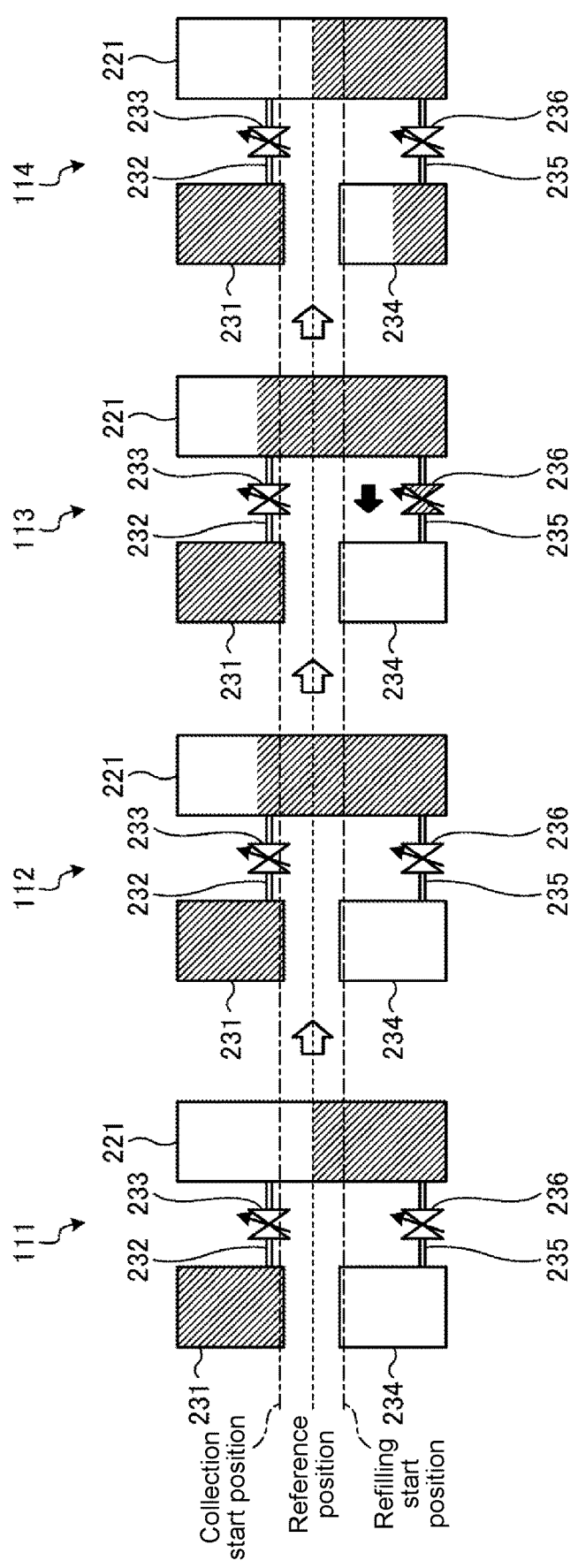
FIG. 5 is a diagram describing an example operation of collecting the heating medium in the embodiment.

FIG. 5 is a diagram describing an example operation of collecting the heating medium in the present embodiment. FIG. 5 shows a state 111 in which the liquid surface in the reservoir tank 221 is at the reference position. In this state, the first sub-tank 231 is filled with the heating medium for refilling, and the second sub-tank 234 is empty. The first valve 233 and the second valve 236 are both closed.

As shown in a state 112, when the liquid surface in the reservoir tank 221 rises to a position above or equal to the collection start position, the control device 11 controls the second valve 236 to open as shown in a state 113. The heating medium is then collected in the second sub-tank 234 from the reservoir tank 221 through the pipe 235. The heating medium moves from the reservoir tank 221 to the second sub-tank 234 under gravity. Subsequently, when the liquid surface in the reservoir tank 221 reaches the reference position as shown in a state 114, the control device 11 controls the second valve 236 to close. This completes collection of the heating medium from the reservoir tank 221.

First Modification

In the above embodiment, the first sub-tank 231 and the second sub-tank 234 are located adjacent to the side surface of the reservoir tank 221. The first sub-tank 231 may be located above the upper surface of the reservoir tank 221, and the second sub-tank 234 may be located below the lower surface of the reservoir tank 221. This embodiment will now be described as a first modification. A substrate processing apparatus, some components of a temperature control device, and a liquid amount control method according to the first modification are the same as or similar to those in the above embodiment and will not be described repeatedly.

Figure 6:
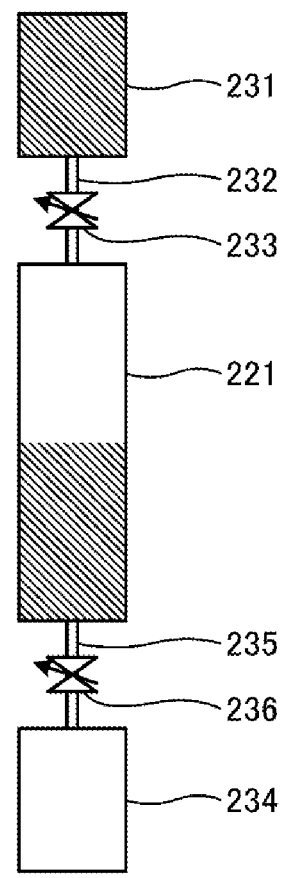
FIG. 6 is a diagram of sub-tanks in a first modification, showing their example arrangement.

FIG. 6 is a diagram of sub-tanks in a first modification, showing their example arrangement. In the first modification shown in FIG. 6, a first sub-tank 231 is located above the upper surface of a reservoir tank 221. The first sub-tank 231 is connected to the upper surface of the reservoir tank 221 with a pipe 232 and a first valve 233. As in the embodiment, the first valve 233 is controlled to open in response to the liquid surface in the reservoir tank 221 reaching the refilling start position and to close in response to the liquid surface reaching the reference position. The heating medium in the first sub-tank 231 is added to the reservoir tank 221.

In the first modification, a second sub-tank 234 is located below the lower surface of the reservoir tank 221. The second sub-tank 234 is connected to the lower surface of the reservoir tank 221 with a pipe 235 and a second valve 236. As in the embodiment, the second valve 236 is controlled to open in response to the liquid surface in the reservoir tank 221 reaching the collection start position and to close in response to the liquid surface reaching the reference position. The heating medium in the reservoir tank 221 is collected in the second sub-tank 234. The first sub-tank 231 may be located above the upper surface of the reservoir tank 221, and the second sub-tank 234 may be located adjacent to a side surface of the reservoir tank 221. The first sub-tank 231 may be located adjacent to a side surface of the reservoir tank 221, and the second sub-tank 234 may be located below the lower surface of the reservoir tank 221.

Second Modification

In the above embodiment, the heating medium collected in the second sub-tank 234 is manually transferred by the operator to, for example, another container. The heating medium may be transferred from the second sub-tank 234 to the first sub-tank 231 with a pump. This embodiment will now be described as a second modification. A substrate processing apparatus, some components of a temperature control device, and a liquid amount control method according to the second modification are the same as or similar to those in the above embodiment and will not be described repeatedly.

Figure 7:
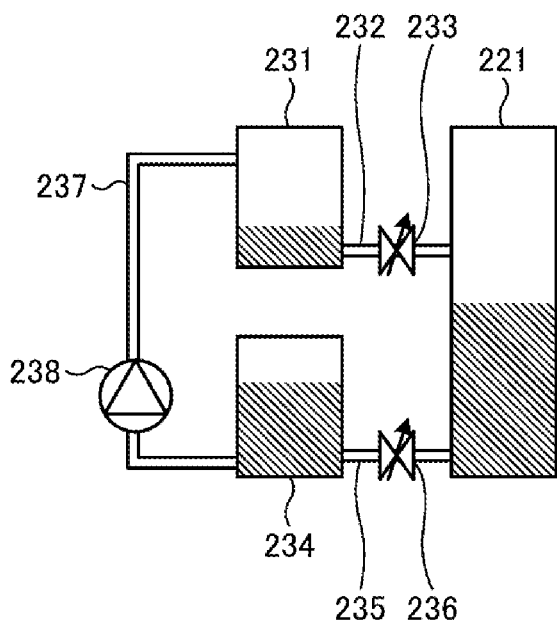
FIG. 7 is a diagram showing a pump in a second modification, showing its example connection.

FIG. 7 is a diagram showing a pump in the second modification, showing its example connection. In the second modification shown in FIG. 7, a pipe 237 connects a lower portion of a second sub-tank 234 and an upper portion of a first sub-tank 231. The pipe 237 receives a pump 238 for transferring the heating medium from the second sub-tank 234 to the first sub-tank 231. The heating medium collected in the second sub-tank 234 is transferred to the first sub-tank 231 through the pipe 237 through the operation of the pump 238 with a first valve 233 and a second valve 236 being closed. This eliminates the operator's manual transferring of the heating medium collected in the second sub-tank 234 to, for example, another container. The collected heating medium can be reused for refilling.

The pipe 237 is connected to an upper portion of a side surface of the first sub-tank 231 in FIG. 7. In some embodiments, the pipe 237 may be connected to the upper surface of the first sub-tank 231 to maximize the capacity of the first sub-tank 231. The pipe 237 may include a valve (not shown) that opens simply when the heating medium is transferred from the second sub-tank 234 to the first sub-tank 231 and is closed during normal operation. The pipe 237 including such a valve may be connected to the first sub-tank 231 at any position, such as a lower portion of the side surface.

Third Modification

The temperature control device 20 described in the above embodiment includes one temperature controller 220 for circulating the heating medium. A temperature control device may circulate multiple heating media with different temperatures. This embodiment will now be described as a third modification. A substrate processing apparatus, some components of a temperature control device, and a liquid amount control method in the third modification are the same as or similar to those in the above embodiment and will not be described repeatedly.

Figure 8:
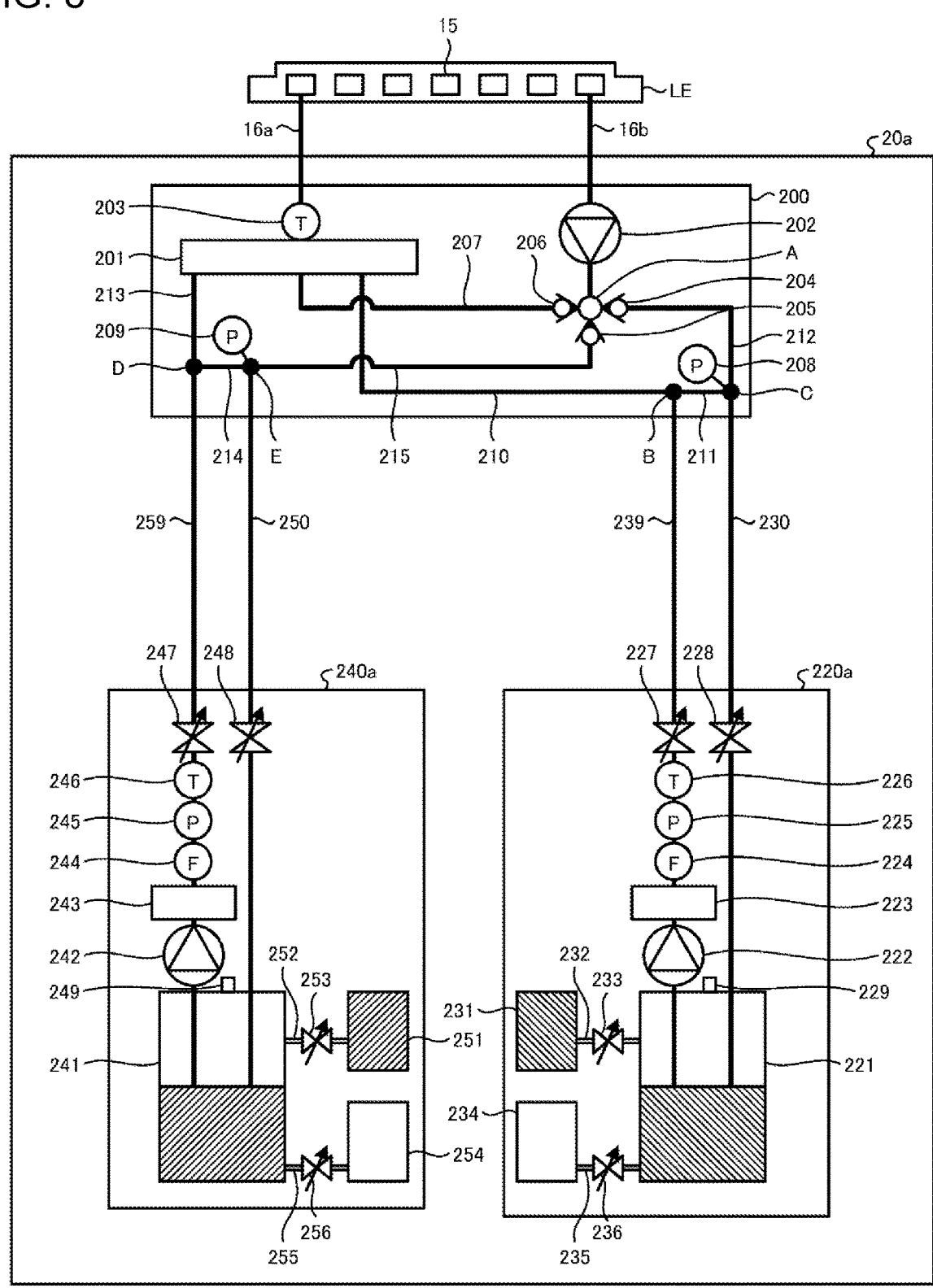
FIG. 8 is a diagram of an example temperature control device according to a third modification.

FIG. 8 is a diagram of an example temperature control device according to the third modification. A temperature control device 20a includes a circulator 200, a first temperature controller 220a, and a second temperature controller 240a. The circulator 200 is installed on, for example, the same floor as the process chamber 12, and the first temperature controller 220a and the second temperature controller 240a are installed on a lower floor than the circulator 200.

The circulator 200 includes a valve 201 with an outlet connected to the pipe 16a. The circulator 200 also includes a pump 202 that circulates the heating medium flowing through the channel 15 in the lower electrode LE. The pump 202 is connected to the pipe 16b. The pipe 16b at the outlet of the pump 202 is connected to the inlet of the valve 201 with a check valve 206 at a connection position A and a pipe 207. During the operation of the pump 202, the pipe 207 has a pressure lower than the pressure in the pipe 16b at the outlet of the pump 202, causing the check valve 206 to open. The heating medium thus circulates on a path through the pump 202, the pipe 16b, the check valve 206, the pipe 207, the valve 201, the pipe 16a, the channel 15, and the pipe 16b. The pipe 16a in the circulator 200 receives a temperature sensor 203 that detects the temperature at the inlet of the channel 15. The temperature sensor 203 may be external to the temperature control device 20a. For example, the temperature sensor 203 may be located immediately below the lower electrode LE, or for example, at a connection between the pipe 16a and the channel 15, or may be at a middle position between the lower electrode LE and the temperature control device 20a.

The first temperature controller 220a is connected to the pipe 16a with a pipe 239, a pipe 210, and the valve 201. The first temperature controller 220a is also connected to the pipe 16b with a pipe 230, a pipe 212, and a check valve 204. A pipe 211 as a bypass pipe connects a connection position B between the pipes 239 and 210 and a connection position C between the pipes 230 and 212. A pressure sensor 208 is at the connection position C for monitoring.

In the third modification, the first temperature controller 220a controls the temperature of a first heating medium. The first temperature controller 220a mixes the temperature-controlled first heating medium with the heating medium circulating from the pipe 207 to the pipe 16a through the pipe 239, the pipe 210, and the valve 201, and supplies the resultant heating medium into the channel 15 in the lower electrode LE. The first heating medium has a higher temperature than a second heating medium and may have a temperature of, for example, 90° C. The first heating medium may have any temperature higher than the temperature of the second heating medium. The pressures in the pipes 210 to 212, 230, and 239 decrease when the first heating medium is supplied into the channel 15 in the lower electrode LE. The heating medium discharged from the channel 15 passes through the check valve 204, which is partially open in response to a decrease in the pressure at the connection position A with the pipe 16*b*, and returns to the first temperature controller 220*a* through the pipes 212 and 230. The piping including the pipes 239, 210, and 16*a* is an example of supply piping. The piping including pipes 16*b*, 212, and 230 is an example of return piping.

In the first temperature controller 220*a*, a pump 222 supplies the heating medium in a reservoir tank 221 into the pipe 239. A heat exchanger 223, a flow rate sensor 224, a pressure sensor 225, a temperature sensor 226, and a variable valve 227 are located near the outlet of the pump 222. In other words, the heat exchanger 223, the flow rate sensor 224, the pressure sensor 225, the temperature sensor 226, and the variable valve 227 are located immediately downstream from the pump 222. The heat exchanger 223 heats or cools the heating medium to be supplied to the pipe 239 to a set temperature. The flow rate sensor 224 detects the flow rate of the heating medium supplied from the pump 222 in an upstream portion of the pipe 239. The pressure sensor 225 detects the pressure of the heating medium supplied from the pump 222 in the upstream portion of the pipe 239. The temperature sensor 226 detects the temperature of the heating medium supplied from the pump 222 in the upstream portion of the pipe 239. The variable valve 227, together with a variable valve 228 on the pipe 230 being a return pipe, adjusts the pressure of the heating medium supplied from the pump 222 in the pipe 239. In the third modification, the reservoir tank 221 is an example of a main tank. The reservoir tank 221 is connected to a first sub-tank 231 and to a second sub-tank 234 as in the embodiment.

The second temperature controller 240*a* is connected to the pipe 16*a* with a pipe 259, a pipe 213, and the valve 201. The second temperature controller 240*a* is also connected to the pipe 16*b* with a pipe 250, a pipe 215, and a check valve 205. A pipe 214 as a bypass pipe connects a connection position D between the pipes 259 and 213 and a connection position E between the pipes 250 and 215. A pressure sensor 209 is at the connection position E for monitoring.

In the third modification, the second temperature controller 240*a* controls the temperature of the second heating medium. The second temperature controller 240*a* mixes the temperature-controlled second heating medium with the heating medium circulating from the pipe 207 to the pipe 16*a* through the pipe 259, the pipe 213, and the valve 201, and supplies the resultant heating medium into the channel 15 in the lower electrode LE. The second heating medium has a lower temperature than the first heating medium and may have a temperature of, for example, −10° C. The second heating medium may have any temperature lower than the temperature of the first heating medium. The pressures in the pipes 213 to 215, 250, and 259 decrease when the second heating medium is supplied into the channel 15 in the lower electrode LE. The heating medium discharged from the channel 15 passes through the check valve 205 that opens partially in response to a decrease in the pressure at the connection position A with the pipe 16*b* and returns to the second temperature controller 240*a* through the pipes 215 and 250.

In the second temperature controller 240*a*, a pump 242 supplies the heating medium in a reservoir tank 241 into the pipe 259. A heat exchanger 243, a flow rate sensor 244, a pressure sensor 245, a temperature sensor 246, and a variable valve 247 are located near the outlet of the pump 242. In other words, the heat exchanger 243, the flow rate sensor 244, the pressure sensor 245, the temperature sensor 246, and the variable valve 247 are located immediately downstream from the pump 242. The heat exchanger 243 heats or cools the heating medium to be supplied to the pipe 259 to a set temperature. The flow rate sensor 244 detects the flow rate of the heating medium supplied from the pump 242 in an upstream portion of the pipe 259. The pressure sensor 245 detects the pressure of the heating medium supplied from the pump 242 in the upstream portion of the pipe 259. The temperature sensor 246 detects the temperature of the heating medium supplied from the pump 242 in the upstream portion of the pipe 259. The variable valve 247, together with a variable valve 248 on the pipe 250 being a return pipe, adjusts the pressure of the heating medium supplied from the pump 242 in the pipe 259. The reservoir tank 241 is an example of a main tank.

A sensor 249 that detects the liquid surface of the heating medium stored in the reservoir tank 241 is located on the upper surface of the reservoir tank 241. The sensor 249 detects the height of the liquid surface of the heating medium with a range sensor that detects reflection from the liquid surface using, for example, ultrasonic waves, radio waves, or laser beams. The sensor 249 outputs the detected height of the liquid surface to the control device 11. The control device 11 determines the liquid amount of the heating medium in the reservoir tank 241 based on the height of the liquid surface. The sensor 249 may be another type of sensor, such as a floating sensor, that detects the height of the liquid surface of the heating medium. The sensor 249 may determine the liquid amount of the heating medium in the reservoir tank 241 by weighing the reservoir tank 241. The height of the liquid surface detected by the sensor 249 is associated with the liquid amount in advance. In other words, as in the reservoir tank 221, a reference position is the height of the liquid surface corresponding to a reference value of the liquid amount, a refilling start position is the height of the liquid surface corresponding to a refilling start level of the liquid amount, and a collection start position is the height of the liquid surface corresponding to a collection start level of the liquid amount. The reference position, the refilling start position, and the collection start position can each be set at any position that can maintain circulation of the heating medium without an overflow.

A first sub-tank 251 is at a position above the reference position of the liquid surface in the reservoir tank 241. The first sub-tank 251 is connected to the reservoir tank 241 with a pipe 252 and a first valve 253 at a position above the reference position of the liquid surface in the reservoir tank 241. The pipe 252 is connected to a side surface of the first sub-tank 251 at or near the bottom of the side surface. The first sub-tank 251 stores the heating medium to be added when the level of the heating medium in the reservoir tank 241 is below the reference position by a predetermined amount and reaches the refilling start position. The first valve 253 is controlled to open in response to the liquid surface in the reservoir tank 241 reaching the refilling start position and to close in response to the liquid surface reaching the reference position. The first sub-tank 251 may include a liquid-level meter such as a level gauge to allow the operator to check the internal liquid amount. The pipe 252 is an example of a first connector pipe. The first valve 253 may be an on-off control valve or a proportional control valve.

A second sub-tank 254 is at a position below the reference position of the liquid surface in the reservoir tank 241. The second sub-tank 254 is connected to the reservoir tank 241 with a pipe 255 and a second valve 256 at a position below the reference position of the liquid surface in the reservoir tank 241. The pipe 255 is connected to a side surface of the reservoir tank 241 at or near the bottom of the side surface. The second sub-tank 254 stores the heating medium collected when the level of the heating medium in the reservoir tank 241 exceeds the reference position by a predetermined amount and reaches the collection start position. The second valve 256 is controlled to open in response to the liquid surface in the reservoir tank 241 reaching the collection start position and to close in response to the liquid surface reaching the reference position. The second sub-tank 254 may include a liquid-level meter such as a level gauge to allow the operator to check the internal liquid amount. The pipe 255 is an example of a second connector pipe. The second valve 256 may be an on-off control valve or a proportional control valve.

In the third modification, the control device 11 controls the opening degrees of the valves 201, 227, 228, 247, and 248, the pumping pressures of the pumps 202, 222, and 242, and the temperatures in the heat exchangers 223 and 243. The pumps 202, 222, and 242 can each control its pumping pressure based on the frequency of an inverter. The opening degree of the valve 201 is adjustable between, for example, +100 to −100%. When the opening degree of the valve 201 is at a position of 0%, the heating medium from the pipe 207 entirely flows into the pipe 16*a*, and the heating media from the pipe 210 and from the pipe 213 do not flow into the pipe 16*a*. When the opening degree of the valve 201 is at a position of +100%, the heating medium from the pipe 210 entirely flows into the pipe 16*a*, and the heating media from the pipe 207 and from the pipe 213 do not flow into the pipe 16*a*. When the opening degree of the valve 201 is at a position of −100%, the heating medium from the pipe 213 entirely flows into the pipe 16*a*, and the heating media from the pipe 207 and from the pipe 210 do not flow into the pipe 16*a*.

In other words, to increase the temperature of the circulating heating medium by mixing the first heating medium having a higher temperature, the opening degree of the valve 201 is changed positively from the position of 0%. To decrease the temperature of the circulating heating medium by mixing the second heating medium having a lower temperature, the opening degree of the valve 201 is changed negatively from the position of 0%. For example, when plasma processing is performed by igniting plasma in the process space PS, heat enters the lower electrode LE from the plasma. Thus, to maintain the lower electrode LE at a predetermined temperature, the opening degree of the valve 201 is set to, for example, −10% to cause the heating medium circulating through the pipe 207 to have a flow rate of 90% and to be mixed with 10% of the second heating medium having a lower temperature from the pipe 213.

With the liquid amount control method according to the third modification, the control device 11 performs the liquid amount control method according to the embodiment shown in FIG. 3 on the first temperature controller 220*a* and on the second temperature controller 240*a*. In other words, in the third modification, the liquid amount of the heating medium can be automatically controlled individually for the first temperature controller 220*a* and the second temperature controller 240*a* to maintain a predetermined value. The first sub-tanks 231 and 251 and the second sub-tanks 234 and 254 can receive maintenance while the substrate processing apparatus 1 and the temperature control device 20*a* are operating and the heating medium in the reservoir tanks 221 and 241 are circulating. In other words, the temperature control device 20*a* can operate without downtime. Additionally, the first sub-tanks 231 and 251 for refilling are at positions above the reference positions of the liquid surfaces in the reservoir tanks 221 and 241, and the second sub-tanks 234 and 254 for collection are at positions below the reference positions of the liquid surfaces in the reservoir tanks 221 and 241. Thus, the heating medium can be added and collected by simply controlling the first valves 233 and 253 and the second valves 236 and 256.

Fourth Modification

In the temperature control device 20*a* described in the third modification, the heating medium circulates in the circulator 200. In another type of a temperature control device, the heating medium that flows through the channel 15 in the lower electrode LE may be switched between the first heating medium and the second heating medium. This embodiment will now be described as a fourth modification. A substrate processing apparatus, some components of a temperature control device, and a liquid amount control method according to the fourth modification are the same as or similar to those in the third modification described above and are not described repeatedly.

Figure 9:
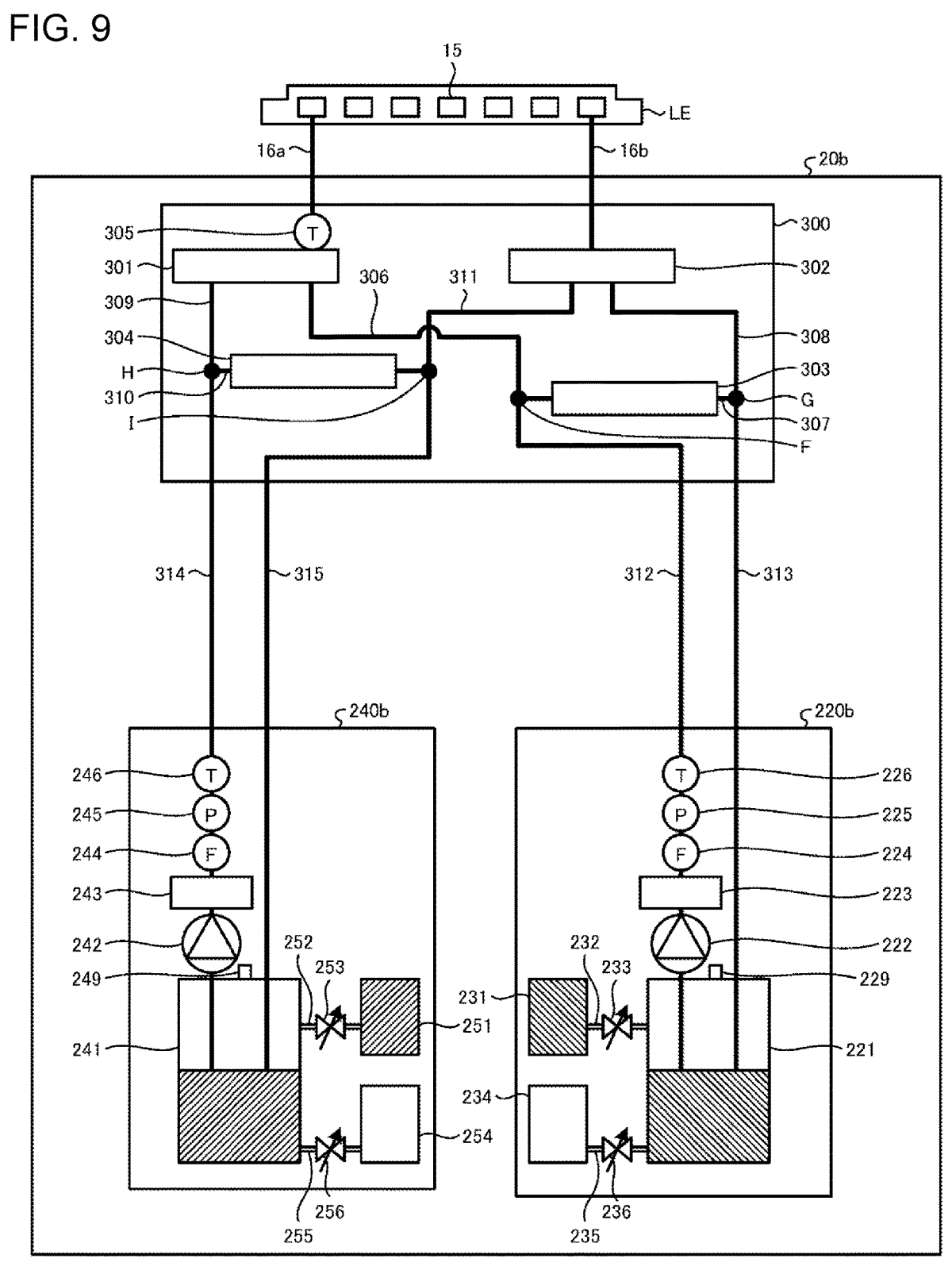

FIG. 9 is a diagram of an example temperature control device according to the fourth modification. A temperature control device 20*b* shown in FIG. 9 includes a switch 300, a first temperature controller 220*b*, and a second temperature controller 240*b* in place of the circulator 200, the first temperature controller 220*a*, and the second temperature controller 240*a* in the temperature control device 20*a* according to the third modification described above. The switch 300 includes valves 301 to 304, a temperature sensor 305, and pipes 306 to 311.

The first temperature controller 220*b* is connected to the pipe 16*a* with a pipe 312, the pipe 306, and the valve 301. The first temperature controller 220*b* is also connected to the pipe 16*b* with a pipe 313, the pipe 308, and the valve 302. In the fourth modification, the first temperature controller 220*b* controls the temperature of the first heating medium having a higher temperature. The first temperature controller 220*b* supplies the temperature-controlled first heating medium into the channel 15 in the lower electrode LE through the pipe 312, the pipe 306, the valve 301, and the pipe 16*a*. The heating medium supplied to the channel 15 in the lower electrode LE returns to the first temperature controller 220*b* through the pipe 16*b*, the valve 302, the pipe 308, and the pipe 313. The piping including the pipes 312, 306, and 16*a* is an example of supply piping. The piping including the pipes 16*b*, 308, and 313 is an example of return piping.

The second temperature controller 240*b* is connected to the pipe 16*a* with a pipe 314, the pipe 309, and the valve 301. The second temperature controller 240*b* is also connected to the pipe 16*b* with a pipe 315, the pipe 311, and the valve 302. In the fourth modification, the second temperature controller 240*b* controls the temperature of the second heating medium having a lower temperature. The second temperature controller 240*b* supplies the temperature-controlled second heating medium into the channel 15 in the lower electrode LE through the pipe 314, the pipe 309, the valve 301, and the pipe 16*a*. The heating medium supplied to the channel 15 in the lower electrode LE returns to the second temperature controller 240*b* through the pipe 16*b*, the valve 302, the pipe 311, and the pipe 315. The piping including the pipes 314, 309, and 16*a* is an example of supply piping. The piping including the pipes 16*b*, 311, and 315 is an example of return piping.

The valve 301 is located at a connection of the pipe 16*a*, the pipe 306, and the pipe 309, and switches the heating medium that flows through the channel 15 in the lower electrode LE to the first heating medium or the second heating medium. The valve 302 is located at a connection of the pipe 16b, the pipe 308, and the pipe 311, and switches the destination of the heating medium flowing out of the channel 15 in the lower electrode LE to the first temperature controller 220b or the second temperature controller 240b.

A pipe 307 as a bypass pipe connects a connection position F between the pipes 312 and 306 and a connection position G between the pipes 313 and 308. The pipe 307 includes the bypass valve 303.

A pipe 310 as a bypass pipe connects a connection point H between the pipes 314 and 309 and a connection position I between the pipes 315 and 311. The pipe 310 includes the bypass valve 304.

The pipe 16a in the temperature control device 20b receives the temperature sensor 305 that measures the temperature at the inlet of the channel 15. The temperature sensor 305 may be external to the temperature control device 20b. For example, the temperature sensor 305 may be located immediately below the lower electrode LE, or for example, at a connection between the pipe 16a and the channel 15, or may be at a middle position between the lower electrode LE and the temperature control device 20b.

The control device 11 controls opening and closing of the valves 301 and 302 and the bypass valves 303 and 304 individually. The first temperature controller 220b and the second temperature controller 240b are the same as the first temperature controller 220a and the second temperature controller 240a in the third modification described above, except that the variable valves 227, 228, 247, and 248 are eliminated, and are not described repeatedly.

When the temperature control device 20b supplies the first heating medium having a higher temperature into the channel 15 in the lower electrode LE, the valve 301 is open to the pipe 306 and is closed to the pipe 309. The valve 302 is open to the pipe 308 and is closed to the pipe 311. The bypass valve 303 is closed. The bypass valve 304 is open. Thus, the first heating medium having a higher temperature supplied from the first temperature controller 220b is supplied into the channel 15 in the lower electrode LE and returns to the first temperature controller 220b. The second heating medium having a lower temperature supplied from the second temperature controller 240b returns to the second temperature controller 240b through the bypass valve 304.

When the temperature control device 20b supplies the second heating medium having a lower temperature into the channel 15 in the lower electrode LE, the valve 301 is closed to the pipe 306 and is open to the pipe 309. The valve 302 is closed to the pipe 308 and is open to the pipe 311. The bypass valve 303 is open. The bypass valve 304 is closed. Thus, the second heating medium having a lower temperature supplied from the second temperature controller 240b is supplied into the channel 15 in the lower electrode LE and returns to the second temperature controller 240b. The first heating medium having a higher temperature supplied from the first temperature controller 220b returns to the first temperature controller 220b through the bypass valve 303.

In the liquid amount control method according to the fourth modification, the control device 11 performs, as in the third modification, the liquid amount control method according to the embodiment shown in FIG. 3 for the first temperature controller 220b and for the second temperature controller 240b. In other words, in the fourth modification, the liquid amount of the heating medium can be automatically controlled individually for the first temperature controller 220b and the second temperature controller 240b to maintain a predetermined value.

Fifth Modification

In the third and fourth modifications, the first sub-tank 231 and the second sub-tank 234 in the first temperature controllers 220a and 220b are separate from the first sub-tank 251 and the second sub-tank 254 in the second temperature controllers 240a and 240b. These sub-tanks may be connected. This embodiment will now be described as a fifth modification. A substrate processing apparatus, some components of a temperature control device, and a liquid amount control method according to the fifth modification are the same as or similar to those in the third and fourth modifications described above and are not described repeatedly.

Figure 10:
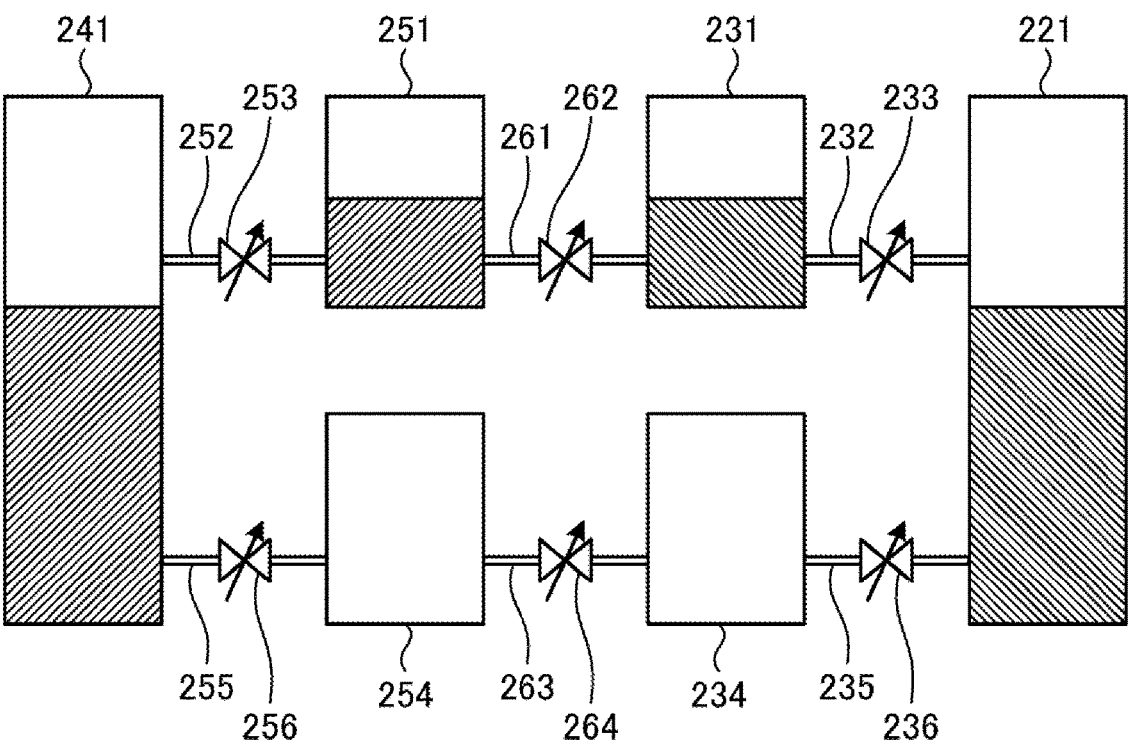
FIG. 10 is a diagram of sub-tanks in a fifth modification, showing their example connection.

FIG. 10 is a diagram of sub-tanks in the fifth modification, showing their example connection. As shown in FIG. 10, a first sub-tank 231 is connected to a first sub-tank 251 with a pipe 261 and a third valve 262 in the fifth modification. The pipe 261 is connected to a side surface of each of the first sub-tanks 231 and 251a at or near the bottom of the side surface. When one of the first sub-tanks 231 and 251 has an insufficient amount of the heating medium and the third valve 262 is open, the pipe 261 supplies the heating medium in the other tank into the tank with an insufficient amount of the heating medium. In other words, the third valve 262 is closed during normal operation. The pipe 261 is an example of a third connector pipe. The third valve 262 may be an on-off control valve or a proportional control valve.

In the fifth modification, a second sub-tank 234 is connected to a second sub-tank 254 with a pipe 263 and a fourth valve 264. The pipe 263 is connected to a side surface of each of the second sub-tanks 234 and 254 at or near the bottom of the side surface. When one of the second sub-tanks 234 and 254 is fully filled with the heating medium and the fourth valve 264 is open, the pipe 263 transfers the heating medium to the other of the second sub-tanks 254 and 234. In other words, the fourth valve 264 is closed during normal operation. The pipe 263 is an example of a fourth connector pipe. The fourth valve 264 may be an on-off control valve or a proportional control valve.

In the temperature control devices 20a and 20b according to the third and fourth modifications, the heating medium flowing through the channel 15 undergoes temperature control or switching repeatedly and may be unevenly stored in one of the reservoir tanks 221 and 241. In this case, in the fifth modification, the heating medium is transferred between the first sub-tanks 231 and 251 and between the second sub-tanks 234 and 254 to equalize the amounts of the heating medium in reservoir tanks 221 and 241.

For example, when the level of the heating medium in the reservoir tank 221 after the entire heating medium is added to the first sub-tank 231 does not reach the reference position, the control device 11 opens the third valve 262 to transfer the heating medium from the first sub-tank 251 to the first sub-tank 231. The heating medium transferred to the first sub-tank 231 is added to the reservoir tank 221. In another example, when the level of the heating medium in the reservoir tank 221 exceeds the reference position after the second sub-tank 234 is fully filled with the collected heating medium, the control device 11 opens the fourth valve 264 to transfer the heating medium from the second sub-tank 234 to the second sub-tank 254. This generates an empty space in the second sub-tank 234 and allows additional collection of the heating medium from the reservoir tank 221. For the reservoir tank 241, the heating medium can be transferred from the first sub-tank 231 to the first sub-tank 251 or from the second sub-tank 254 to the second sub-tank 234 as in the reservoir tank 221.

In the present embodiment, the temperature control device 20 includes the main tank (reservoir tank 221) storing the heating medium, the first sub-tank 231 at a position above the reference position of the liquid surface in the main tank, the second sub-tank 234 at a position below the reference position in the main tank, the first connector pipe (pipe 232) connecting the first sub-tank 231 and the main tank and including the first valve 233, the second connector pipe (pipe 235) connecting the second sub-tank 234 and the main tank and including the second valve 236, and the controller (control device 11) that controls the first valve 233 and the second valve 236 based on the liquid amount in the main tank. Thus, the liquid amount of the heating medium can be controlled automatically.

In the present embodiment, the liquid amount is based on the liquid surface in the main tank detected by the sensor 229 located on the main tank to detect the liquid surface of the heating medium. Thus, the liquid amount of the heating medium can be controlled automatically.

In the present embodiment, the first connector pipe is connected to the main tank and to the first sub-tank at a position above the reference position in the main tank. Thus, the heating medium stored in the first sub-tank 231 can be added to the main tank (reservoir tank 221).

In the present embodiment, the first sub-tank has its bottom at a position above the reference position in the main tank. Thus, the heating medium stored in the first sub-tank 231 can be added to the main tank (reservoir tank 221).

In the present embodiment, the second connector pipe is connected to the main tank and to the second sub-tank at a position below the reference position in the main tank. Thus, the heating medium can be collected from the main tank to the second sub-tank 234.

In the present embodiment, the second sub-tank has its top at a position below the reference position in the main tank. Thus, the heating medium can be collected from the main tank to the second sub-tank 234.

In the present embodiment, the first sub-tank 231 is adjacent to a side surface of the main tank. Thus, the heating medium stored in the first sub-tank 231 can be added to the main tank.

In the present embodiment, the first sub-tank 231 is adjacent to the upper surface of the main tank. Thus, the heating medium stored in the first sub-tank 231 can be added to the main tank.

In the present embodiment, the second sub-tank 234 is adjacent to a side surface of the main tank. Thus, the heating medium can be collected from the main tank to the second sub-tank 234.

In the present embodiment, the second sub-tank 234 is adjacent to the lower surface of the main tank. Thus, the heating medium can be collected from the main tank to the second sub-tank 234.

In the present embodiment, the first valve 233 is controllable to open in response to the liquid surface in the main tank reaching the refilling start position and to close in response to the liquid surface in the main tank reaching the reference position. Thus, the liquid amount of the heating medium in the main tank can be controlled automatically.

In the present embodiment, the second valve 236 is controlled to open in response to the liquid surface in the main tank reaching the collection start position and to close in response to the liquid surface in the main tank reaching the reference position. Thus, the liquid amount of the heating medium in the main tank can be controlled automatically.

The structure according to the present embodiment includes the pipe 237 and the pump 238 that transfer the heating medium from the second sub-tank 234 to the first sub-tank 231. Thus, the collected heating medium can be reused for refilling.

The embodiment disclosed herein is illustrative in all aspects and should not be construed to be restrictive. The components in the above embodiment may be eliminated, substituted, or modified in various forms without departing from the spirit and scope of the appended claims.

In the above embodiment, the temperature control device 20 uses a single heating medium circulation system, but the technique according to the present disclosure is not limited to this. The technique according to the present disclosure is applicable to, for example, a temperature control device including two or more heating medium circulation systems.

In the above embodiment, capacitively coupled plasma (CCP) is used as an example plasma source, but the technique according to the present disclosure is not limited to this. Plasma sources may include, for example, inductively coupled plasma (ICP), microwave-excited surface wave plasma (SWP), electron cyclotron resonance plasma (ECP), and helicon wave excited plasma (HWP).

In the above embodiment, the substrate processing apparatus 1 is described using a plasma etching processing apparatus as an example, but the technique according to the present disclosure is not limited to this. The technique according to the present disclosure is applicable to any apparatuses other than the etching apparatus, such as film deposition apparatuses, modification apparatuses, or cleaning apparatuses, that use a temperature-controlled heating medium to control the temperature of a temperature control target such as a wafer W.

One or more embodiments of the present disclosure may provide the structure described below.

(1)

A temperature control device, comprising:
a main tank storing a heating medium;
a first sub-tank at a position above a reference position of a liquid surface in the main tank;
a second sub-tank at a position below the reference position in the main tank;
a first connector pipe connecting the first sub-tank and the main tank and including a first valve;
a second connector pipe connecting the second sub-tank and the main tank and including a second valve; and
a controller configured to control the first valve and the second valve based on a liquid amount in the main tank.

(2)

The temperature control device according to (1), wherein the liquid amount is based on the liquid surface in the main tank detected by a sensor located on the main tank to detect a liquid surface of the heating medium.

(3)

The temperature control device according to (1) or (2), wherein the first connector pipe is connected to the main tank and to the first sub-tank at a position above the reference position in the main tank.

(4)

The temperature control device according to any one of (1) to (3), wherein the first sub-tank has a bottom at a position above the reference position in the main tank.

(5)

The temperature control device according to any one of (1) to (4), wherein the second connector pipe is connected to the main tank and to the second sub-tank at a position below the reference position in the main tank.

(6)

The temperature control device according to any one of (1) to (5), wherein the second sub-tank has a top at a position below the reference position in the main tank.

(7)

The temperature control device according to any one of (1) to (6), wherein the first sub-tank is adjacent to a side surface of the main tank.

(8)

The temperature control device according to any one of (1) to (6), wherein the first sub-tank is adjacent to an upper surface of the main tank.

(9)

The temperature control device according to any one of (1) to (8), wherein the second sub-tank is adjacent to a side surface of the main tank.

(10)

The temperature control device according to any one of (1) to (8), wherein the second sub-tank is adjacent to a lower surface of the main tank.

(11)

The temperature control device according to any one of (1) to (10), wherein the first valve is controllable to open in response to the liquid surface in the main tank reaching a refilling start position and to close in response to the liquid surface in the main tank reaching the reference position.

(12)

The temperature control device according to any one of (1) to (11), wherein the second valve is controlled to open in response to the liquid surface in the main tank reaching a collection start position and to close in response to the liquid surface in the main tank reaching the reference position.

(13)

The temperature control device according to any one of (1) to (12), further comprising:

a pipe and a pump configured to transfer the heating medium from the second sub-tank to the first sub-tank.

(14)

A substrate processing apparatus, comprising:

a temperature control device configured to control a temperature of a temperature control target member, the temperature control device including a main tank storing a heating medium, a first sub-tank at a position above a reference position of a liquid surface in the main tank, a second sub-tank at a position below the reference position in the main tank, a first connector pipe connecting the first sub-tank and the main tank and including a first valve, a second connector pipe connecting the second sub-tank and the main tank and including a second valve, and a controller configured to control the first valve and the second valve based on a liquid amount in the main tank.

(15)

The substrate processing apparatus according to (14), wherein the liquid amount is based on the liquid surface in the main tank detected by a sensor located on the main tank to detect a liquid surface of the heating medium.

(16)

A substrate processing apparatus, comprising:

a temperature control device configured to control a temperature of a temperature control target member, the temperature control device including a plurality of temperature controllers, and a controller, wherein each of the plurality of temperature controllers includes a main tank storing a heating medium, a first sub-tank at a position above a reference position of a liquid surface in the main tank, a second sub-tank at a position below the reference position in the main tank, a first connector pipe connecting the first sub-tank and the main tank and including a first valve, and a second connector pipe connecting the second sub-tank and the main tank and including a second valve, and the controller controls the first valve and the second valve in each of the plurality of temperature controllers based on a liquid amount in the main tank.

(17)

The substrate processing apparatus according to (16), wherein the liquid amount is based on the liquid surface in the main tank detected by a sensor located on the main tank to detect a liquid surface of the heating medium.

(18)

A liquid amount control method for a temperature control device, the temperature control device including a main tank storing a heating medium, a first sub-tank at a position above a reference position of a liquid surface in the main tank, a second sub-tank at a position below the reference position in the main tank, a first connector pipe connecting the first sub-tank and the main tank and including a first valve, and a second connector pipe connecting the second sub-tank and the main tank and including a second valve, the method comprising:

controlling the first valve and the second valve based on a liquid amount in the main tank.

REFERENCE SIGNS LIST

1 Substrate processing apparatus
10 Body
11 Control device
12 Process chamber
15 Channel
16*a*, 16*b*, 232, 235, 237, 252, 255, 261, 263 Pipe
20, 20*a*, 20*b* Temperature control device
200 Circulator
220 Temperature controller
220*a*, 220*b* First temperature controller
221, 241 Reservoir tank
222, 238, 242 Pump
229, 249 Sensor
231, 251 First sub-tank
233, 253 First valve
234, 254 Second sub-tank
236, 256 Second valve
240*a*, 240*b* Second temperature controller 262 Third valve
264 Fourth valve
300 Switch
5 ESC Electrostatic chuck
LE Lower electrode
PD Substrate support
W Wafer

The invention claimed is:

1. A temperature control device, comprising:
a main tank configured to store a heating medium;
a first sub-tank at a position above a reference position in the main tank;
a second sub-tank at a position below the reference position in the main tank;
a first connector pipe connecting the first sub-tank and the main tank and including a first valve;
a second connector pipe connecting the second sub-tank and the main tank and including a second valve; and
a controller circuit configured to control the first valve and the second valve based on a liquid amount of the heating medium in the main tank,
wherein
the controller circuit is configured to control the second valve to open in response to a liquid surface of the heating medium in the main tank reaching a collection start position, and to close in response to the liquid surface of the heating medium in the main tank reaching the reference position.

2. The temperature control device according to claim 1, further comprising:
a sensor located on the main tank to detect the liquid surface of the heating medium, wherein
the controller circuit is configured to determine the liquid amount based on a position of the liquid surface of the heating medium detected by the sensor.

3. The temperature control device according to claim 1, wherein
the first connector pipe is connected to the main tank and to the first sub-tank at a position above the reference position in the main tank.

4. The temperature control device according to claim 1, wherein
the first sub-tank has a bottom at a position above the reference position in the main tank.

5. The temperature control device according to claim 1, wherein
the second connector pipe is connected to the main tank and to the second sub-tank at a position below the reference position in the main tank.

6. The temperature control device according to claim 1, wherein
the second sub-tank has a top at a position below the reference position in the main tank.

7. The temperature control device according to claim 1, wherein
the first sub-tank is adjacent to a side surface of the main tank.

8. The temperature control device according to claim 1, wherein
the first sub-tank is adjacent to an upper surface of the main tank.

9. The temperature control device according to claim 1, wherein
the second sub-tank is adjacent to a side surface of the main tank.

10. The temperature control device according to claim 1, wherein the second sub-tank is adjacent to a lower surface of the main tank.

11. The temperature control device according to claim 1, wherein
the controller circuit is configured to control the first valve to open in response to the liquid surface of the heating medium in the main tank reaching a refilling start position, and to close in response to the liquid surface of the heating medium in the main tank reaching the reference position.

12. The temperature control device according to claim 1, further comprising:
a pipe and a pump configured to transfer the heating medium from the second sub-tank to the first sub-tank.

13. A substrate processing apparatus, comprising:
a temperature control device configured to control a temperature of a temperature control target, the temperature control device including
a main tank configured to store a heating medium,
a first sub-tank at a position above a reference position in the main tank,
a second sub-tank at a position below the reference position in the main tank,
a first connector pipe connecting the first sub-tank and the main tank and including a first valve,
a second connector pipe connecting the second sub-tank and the main tank and including a second valve, and
a controller circuit configured to control the first valve and the second valve based on a liquid amount of the heating medium in the main tank,
wherein
the controller circuit is configured to control the second valve to open in response to a liquid surface of the heating medium in the main tank reaching a collection start position, and to close in response to the liquid surface of the heating medium in the main tank reaching the reference position.

14. The substrate processing apparatus according to claim 13, further comprising:
a sensor located on the main tank to detect the liquid surface of the heating medium, wherein
the controller circuit is configured to determine the liquid amount based on a position of the liquid surface of the heating medium detected by the sensor.

15. A substrate processing apparatus, comprising:
a temperature control device configured to control a temperature of a temperature control target, the temperature control device including
a plurality of temperature controllers, and
a controller circuit,
wherein each of the plurality of temperature controllers includes
a main tank configured to store a heating medium,
a first sub-tank at a position above a reference position in the main tank,
a second sub-tank at a position below the reference position in the main tank,
a first connector pipe connecting the first sub-tank and the main tank and including a first valve, and
a second connector pipe connecting the second sub-tank and the main tank and including a second valve, and
the controller circuit is configured to control the first valve and the second valve in each of the plurality of temperature controllers based on a liquid amount of the heating medium in the main tank,
wherein the controller circuit is configured to control the second valve to open in response to a liquid surface of the heating medium in the main tank reaching a collection start position, and to close in response to the liquid surface of the heating medium in the main tank reaching the reference position.

16. The substrate processing apparatus according to claim 15, further comprising:

a sensor located on the main tank to detect a liquid surface of the heating medium, wherein the controller circuit is configured to determine the liquid amount based on a position of the liquid surface of the heating medium detected by the sensor.

17. A liquid amount control method for a temperature control device, the temperature control device including a main tank configured to store a heating medium, a first sub-tank at a position above a reference position in the main tank, a second sub-tank at a position below the reference position in the main tank, a first connector pipe connecting the first sub-tank and the main tank and including a first valve, and a second connector pipe connecting the second sub-tank and the main tank and including a second valve, the method comprising:

controlling the first valve and the second valve based on a liquid amount of the heating medium in the main tank; and controlling the second valve to open in response to a liquid surface of the heating medium in the main tank reaching a collection start position, and to close in response to the liquid surface of the heating medium in the main tank reaching the reference position.

\* \* \* \* \*